United States Patent
Wang et al.

(10) Patent No.: US 9,945,900 B1
(45) Date of Patent: Apr. 17, 2018

(54) TESTING DEVICE FOR RADIO FREQUENCY FRONT END AND RADIO FREQUENCY FRONT END TESTING METHOD

(71) Applicant: UNIVERSAL SCIENTIFIC INDUSTRIAL (SHANGHAI) CO., LTD., Shanghai (CN)

(72) Inventors: Chih-Min Wang, Shanghai (CN); Hung-Wei Lai, Shanghai (CN)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/624,816

(22) Filed: Jun. 16, 2017

(30) Foreign Application Priority Data

Jan. 19, 2017 (CN) .......................... 2017 1 0050644

(51) Int. Cl.
*H04B 17/00* (2015.01)
*G01R 31/28* (2006.01)
*H04B 17/20* (2015.01)

(52) U.S. Cl.
CPC ......... *G01R 31/2822* (2013.01); *H04B 17/20* (2015.01)

(58) Field of Classification Search
CPC ........ H04B 17/11; H04B 17/15; H04B 17/00; H04B 17/20; H04B 17/23
See application file for complete search history.

(56) References Cited

U.S. PATENT DOCUMENTS

| 7,962,923 | B2 * | 6/2011 | Hopkins | G06F 9/52 |
| | | | | 719/320 |
| 8,842,549 | B2 * | 9/2014 | Olgaard | H04L 43/50 |
| | | | | 370/241 |
| 9,628,202 | B2 * | 4/2017 | Holzmann | H04B 17/0085 |
| 2015/0189524 | A1 * | 7/2015 | Hirst | H04W 24/08 |
| | | | | 370/252 |
| 2015/0244477 | A1 * | 8/2015 | Hirst | H04B 17/11 |
| | | | | 455/67.14 |
| 2016/0253252 | A1 | 9/2016 | Holzmann et al. | |

FOREIGN PATENT DOCUMENTS

CN 102571239 B 12/2016
TW I299407 8/2008

* cited by examiner

*Primary Examiner* — Blane Jackson
(74) *Attorney, Agent, or Firm* — Li & Cai Intellectual Property (USA) Office

(57) ABSTRACT

A radio frequency front end testing method and a radio frequency front end testing device are provided in the present disclosure. The radio frequency front end testing device includes a processing module, a first multiplexing module and a second multiplexing module. The radio frequency front end testing method includes the steps of: transmitting a radio frequency front end testing control signal; switching a plurality of output channel terminals of the first multiplexing module and the second multiplexing module, and providing a testing data signal and a radio frequency front end testing clock signal to a plurality of devices under test; and executing a test procedure on the devices under test based on the testing data signal and the radio frequency front end testing clock signal.

10 Claims, 4 Drawing Sheets

| E | S1 | S0 | channel connection |
|---|---|---|---|
| Low | Low | Low | Y0→Z |
| Low | Low | High | Y1→Z |
| Low | High | Low | Y2→Z |
| Low | High | High | Y3→Z |
| High | X | X | OFF |

FIG. 3

TESTING DEVICE FOR RADIO FREQUENCY FRONT END AND RADIO FREQUENCY FRONT END TESTING METHOD

BACKGROUND

1. Technical Field

The present disclosure relates to a radio frequency front end testing technology, and in particular, to a radio frequency front end testing device and a radio frequency front end testing method for simplifying the test process.

2. Description of Related Art

In recent years, due to the burgeoning popularity of mobile devices, demands for mobile networks are increasing and the criteria, especially for the reliability and durability for various modules of mobile network devices, become higher as well. As the amount of RF-related components of the mobile device increases, the control system needs to use a plurality of interfaces to connect the RF-related components. However, controlling the different RF-related components can be simplified by using a standard bus interface.

The MIPI RFFE (RF Front end) is the specification of the bus interface for the mobile system to control the RF front end equipment, which is regulated by the MIPI Alliance. A master device of a MIPI RFFE can control up to 15 slave devices and each slave device has a different slave address, so that the master device of a MIPI RFFE can transmit commands to the specified slave device.

The master device of a MIPI RFFE mainly uses a clock signal line, a data signal line and of course a power signal line. In general, the slave device of a MIPI RFFE includes a clock signal line, a data signal line and a power signal line for being controlled by the master device of a MIPI RFFE.

However, in the aging test of the reliability test procedure, a certain amount of RFFE modules are randomly selected from each batch for aging 500 hours to 1000 hours. In a general aging test, at least 77 RFFE modules are selected from each batch for aging test. However, in conventional testing systems, the address every RFFE module used for test is the same. As each RFFE signal module can only control one RFFE module, each RFFE module has to connect to one RFFE signal module in an aging test.

Therefore, each RFFE module needs to connect to one RFFE signal module in an aging test, that is, 77 RFFE modules have to use 77 RFFE signal modules.

Due to the huge number and the expensive cost of the required RFFE signal modules (the cost of each RFFE signal module is NTD 20,000), the total cost of the RFFE signal modules used for every batch may exceed by tens of millions of NT dollars. Hence, manufacturers may be unable to afford to purchase a great deal of RFFE signal modules to conduct the aging test procedure. Although the testing control signal can be manually provided to each RFFE module, it is time-consuming and not cost-efficient.

Therefore, providing a radio frequency front end testing device to simplify the testing process has become an important issue in the art.

SUMMARY

In order to achieve the above purposes, a radio frequency front end testing device used for testing a radio frequency front end module is provided in the present disclosure. The radio frequency front end testing device includes a processing module receiving a testing control signal from a computer device, a first multiplexing module, a second multiplexing module, and a radio frequency front end signal module. The first multiplexing module includes a first input terminal, a first control terminal, a second control terminal, a third control terminal, a first output channel terminal, a second output channel terminal, a third output channel terminal and a fourth output channel terminal. The first control terminal, the second control terminal and the third control terminal of the first multiplexing module are electrically connected to the processing module. The second multiplexing module includes a first input terminal, a first control terminal, a second control terminal, a third control terminal, a first output channel terminal, a second output channel terminal, a third output channel terminal and a fourth output channel terminal. The first control terminal, the second control terminal and the third control terminal of the second multiplexing module are electrically connected to the processing module. The radio frequency front end signal module includes a first signal terminal and a second signal terminal. The radio frequency front end signal module provides a first signal and a second signal through the first signal terminal and the second signal terminal, respectively. The first signal terminal of the radio frequency front end signal module is electrically connected to the first input terminal of the first multiplexing module. The second signal terminal of the radio frequency front end signal module is electrically connected to the first input terminal of the second multiplexing module. The first output channel terminal of the first multiplexing module and the first output channel terminal of the second multiplexing module are electrically connected to a first device under test. The second output channel terminal of the first multiplexing module and the second output channel terminal of the second multiplexing module are electrically connected to a second device under test. The third output channel terminal of the first multiplexing module and the third output channel terminal of the second multiplexing module are electrically connected to a third device under test. The fourth output channel terminal of the first multiplexing module and the fourth output channel terminal of the second multiplexing module are electrically connected to a fourth device under test.

In order to achieve the above purposes, a radio frequency front end testing device used for testing a radio frequency front end module is provided in the present disclosure. The radio frequency front end testing device includes a processing module receiving a testing control signal from a computer device, a first multiplexing module, a second multiplexing module, and a radio frequency front end signal module. The first multiplexing module is electrically connected to the processing module. The first multiplexing module includes a first output channel terminal and a second output channel terminal. The second multiplexing module is electrically connected to the processing module. The second multiplexing module includes a first output channel terminal and a second output channel terminal. The radio frequency front end signal module includes a first signal terminal and a second signal terminal. The radio frequency front end signal module provides a first signal and a second signal through the first signal terminal and the second signal terminal, respectively. The first signal terminal of the radio frequency front end signal module is electrically connected to the first multiplexing module. The second signal terminal of the radio frequency front end signal module is electrically connected to the second multiplexing module. The first output channel terminal of the first multiplexing module is electrically connected to a first device under test. The first output channel terminal of the second multiplexing module is electrically connected to the first device under test. The second output channel terminal of the first multiplexing module is electrically connected to a second device under test. The second output channel terminal of the second multiplexing module is electrically connected to the second device under test. The processing module switches the first output channel terminal and the second output channel terminal of the first multiplexing module and the second multiplexing module based on the testing control signal of the computer device such that a test procedure is executed on the first device under test and the second device under test based on the at least one testing control signal from the radio frequency front end signal module.

In order to achieve the above purposes, a radio frequency front end testing method is provided in the present disclosure. The radio frequency front end testing method includes the steps: transmitting a radio frequency front end testing control signal; switching a plurality of output channel terminals of a first multiplexing module and a second multiplexing module, and providing a radio frequency front end testing data signal and a radio frequency front end testing clock signal to a plurality of devices under test; and executing a test procedure on the devices under test based on the radio frequency front end testing data signal and the radio frequency front end testing clock signal received.

According to the above descriptions, the radio frequency (RF) front end testing system and the radio frequency (RF) front end testing device of the embodiment of the present disclosure can greatly reduce the operation of manually providing the RF front end test signal, and can effectively utilize the radio frequency (RF) front end signal module. Therefore, the test process can be effectively simplified and executed in a cost-efficient way.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the present disclosure.

FIG. 3 is a schematic diagram of a channel connection of a first multiplexing module of an embodiment of the present disclosure.

DESCRIPTION OF THE EXEMPLARY EMBODIMENTS

Figure 1:
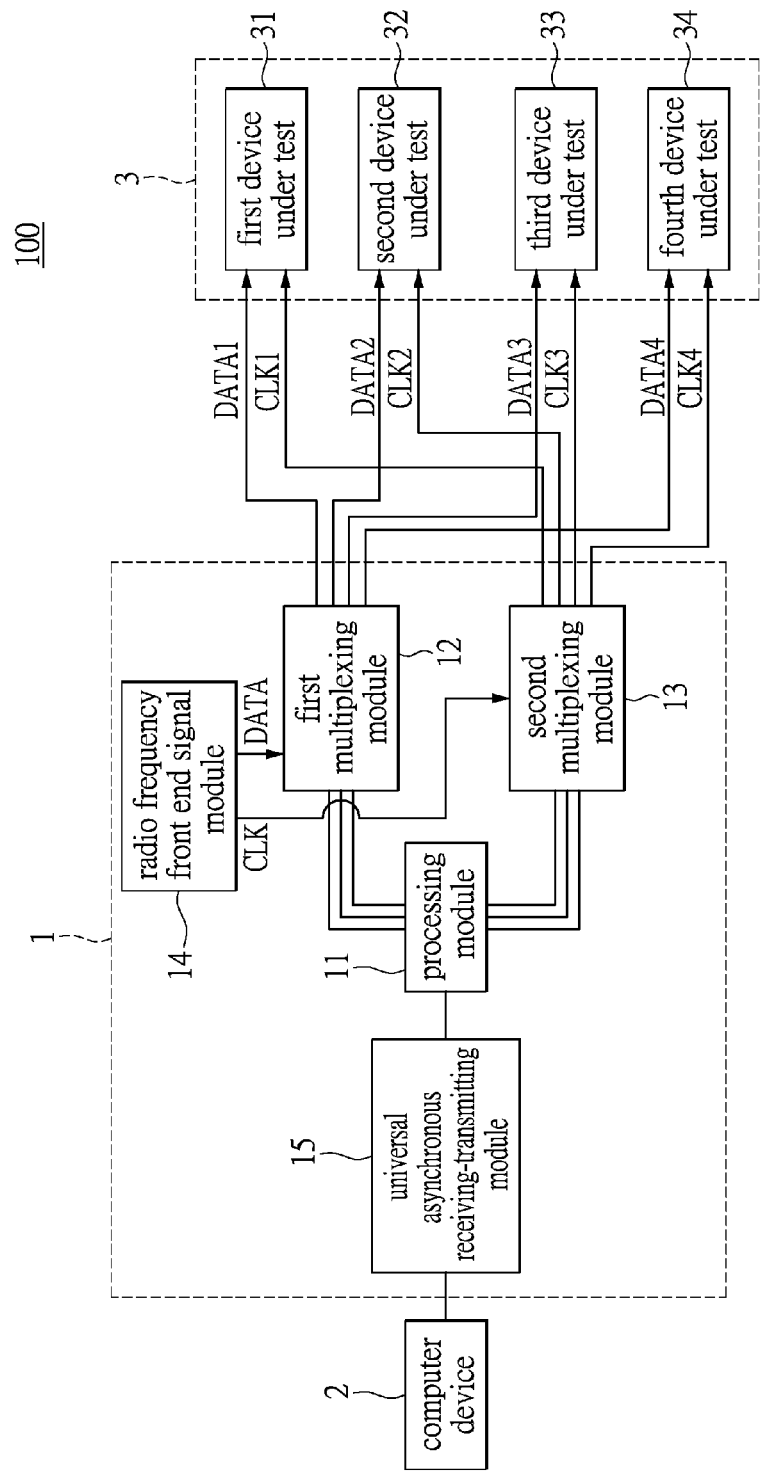
FIG. 1 is a schematic diagram of a radio frequency front end testing system of an embodiment of the present disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

[The embodiment of the radio frequency front end testing system]

Figure 2:
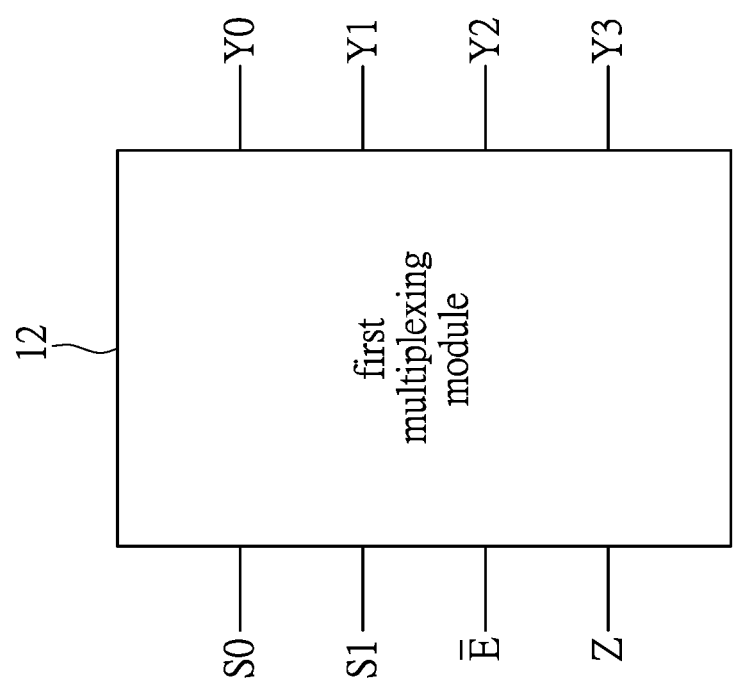
FIG. 2 is a schematic diagram of a first multiplexing module of an embodiment of the present disclosure.
Figure 4:
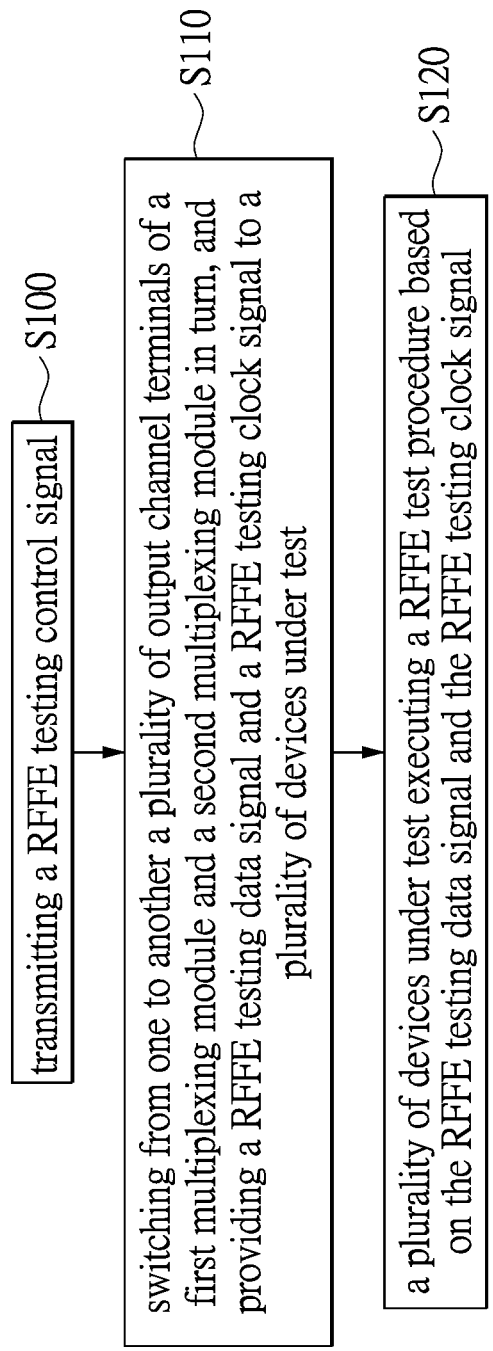
FIG. 4 is a flow chart of a radio frequency front end testing method of an embodiment of the present disclosure.

Referring to FIG. 1 and FIG. 2, FIG. 1 is a schematic diagram of a radio frequency front end testing system of an embodiment of the present disclosure, and FIG. 2 is a schematic diagram of a first multiplexing module of an embodiment of the present disclosure.

In the present embodiment, a radio frequency front end (RFFE) testing system 100 includes a radio frequency front end (RFFE) testing device 1, a computer device 2 and a device under test group 3 (DUT group 3). The DUT group 3 includes a first device under test 31 (first DUT 31), a second device under test 32 (second DUT 32), a third device under test 33 (third DUT 33) and a fourth device under test 34 (fourth DUT 34). In other embodiments, the number of the devices under test (DUTs) of the DUT group 3 can be determined based on the number of the devices under test (DUT) that the radio frequency front end (RFFE) testing device 1 can be in connection with at one time, and the present embodiment is not limited thereto. Specifically, the number of the devices under test (DUT) that the radio frequency front end (RFFE) testing device 1 can be in connection with at one time is determined in accordance with the design of the radio frequency front end (RFFE) testing device 1, to which the present disclosure is not limited. In the present embodiment, the first DUT 31, the second DUT 32, the third DUT 33 and the fourth DUT 34 are radio frequency front end modules.

The RFFE testing device 1 includes a processing module 11, a first multiplexing module 12, a second multiplexing module 13, a RFFE signal module 14 and a universal asynchronous receiving-transmitting module 15 (UART module 15).

The processing module 11 of the RFFE testing device 1 is electrically connected to the computer device 2 through the universal asynchronous receiving-transmitting module 15, and receives a testing control signal from the computer device 2. In the present embodiment, the universal asynchronous receiving-transmitting module 15 is a RS232 serial port; however, in other embodiments, the universal asynchronous receiving-transmitting module 15 can also be, but not limited to a RS232 standard port, a RS449 standard port, a RS423 standard port, a RS422 standard port, a RS485 standard port, or a standard bus. In other words, the computer device 2 transmits the testing control signal to the RFFE testing device 1 through the universal asynchronous receiving-transmitting module 15.

The processing module 11 is electrically connected to the first multiplexing module 12 and the second multiplexing module 13, The RFFE signal module 14 is electrically connected to the first multiplexing module 12 and the second multiplexing module 13 respectively. In the present embodiment, the processing module 11 is electrically connected to the first multiplexing module 12 and the second multiplexing module 13 through a general purpose input/output (GPIO) interface, and provides a switching signal to the first multiplexing module 12 and the second multiplexing module 13. In other embodiments, the processing module 11 can be electrically connected to the first multiplexing module 12 and the second multiplexing module 13 through an inter-integrated circuit interface ($I^2C$) or a serial general purpose input/output interface (SGPIO), and the present disclosure is not limited thereto.

The structure of the second multiplexing module 13 is identical to that of the first multiplexing module 12. Therefore, the first multiplexing module 12 is taken as an example in the following description to describe the present disclosure and the structural features of the second multiplexing module 13 is omitted therein.

In the present embodiment, the RFFE signal module 14 includes a first signal terminal (not shown in the drawings) and a second signal terminal (not shown in the drawings). The first signal terminal is used for outputting a first signal, and the second signal terminal is used for outputting a second signal. In the present embodiment, the first signal is a RFFE testing data signal, and the second signal is a RFFE testing clock signal. More specifically, the first signal terminal (not shown in the drawings) of the RFFE signal module 14 is electrically connected to the first multiplexing module 12, and the second signal terminal (not shown in the drawings) of the RFFE signal module 14 is electrically connected to the second multiplexing module 13. That is to say, the RFFE signal module 14 provides a RFFE testing data signal to the first multiplexing module 12, and provides a RFFE testing clock signal to the second multiplexing module 13.

Referring to FIG. 2, the first multiplexing module 12 includes a first input terminal Z, a first control terminal $\overline{E}$, a second control terminal S0, a third control terminal S1, a first output channel terminal Y0, a second output channel terminal Y1, a third output channel terminal Y2 and a fourth output channel terminal Y3. Since the second multiplexing module 13 is identical to the first multiplexing module 12 in terms of structure, the second multiplexing module 13 also includes a first input terminal Z, a first control terminal E, a second control terminal S0, a third control terminal S1, a first output channel terminal Y0, a second output channel terminal Y1, a third output channel terminal Y2 and a fourth output channel terminal Y3.

In the present embodiment, the first signal terminal (not shown in the drawings) of the RFFE signal module 14 is electrically connected to the first input terminal Z of the first multiplexing module 12, and the second signal terminal (not shown in the drawings) of the RFFE signal module 14 is electrically connected to the first input terminal Z of the second multiplexing module 13. The first output channel terminal Y0, the second output channel terminal Y1, the third output channel terminal Y2 and the fourth output channel terminal Y3 of the first multiplexing module 12 are electrically connected to the first DUT 31, the second DUT 32, the third DUT 33 and the fourth DUT 34, respectively. Similarly, the first output channel terminal Y0, the second output channel terminal Y1, the third output channel terminal Y2 and the fourth output channel terminal Y3 of the second multiplexing module 13 are also electrically connected to the first DUT 31, the second DUT 32, the third DUT 33 and the fourth DUT 34, respectively. In other words, the RFFE signal module 14 provides the RFFE testing data signal DATA (the first signal) and the RFFE testing clock signal CLK (the second signal) to the first DUT 31, the second DUT 32, the third DUT 33 and the fourth DUT 34 through the first multiplexing module 12 and the second multiplexing module 13 respectively.

Referring to FIG. 3, FIG. 3 is a schematic diagram of a channel connection of a first multiplexing module according to an embodiment of the present disclosure.

In the embodiment, the processing module 11 is electrically connected to the first multiplexing module 12 and the second multiplexing module 13. More specifically, the processing module 11 is electrically connected to the first control terminal E of the first multiplexing module 12 and the first control terminal $\overline{E}$ of the second multiplexing module 13. The processing module 11 provides a first switching signal to the first multiplexing module 12 through the first control terminal $\overline{E}$ and provides a first switching signal to the second multiplexing module 13 through the first control terminal $\overline{E}$ to determine whether the first multiplexing module 12 and the second multiplexing module 13 are turned on or turned off. In the embodiment, when the first switching signal is a low level signal, that is to say, the first control terminal $\overline{E}$ of the first multiplexing module 12 and the first control terminal $\overline{E}$ of the second multiplexing module 13 receive a low level signal, the first multiplexing module 12 and the second multiplexing module 13 both transform the low level signal into a high level signal. Afterwards, with reference to FIG. 3, the first multiplexing module 12 and the second multiplexing module 13 will turn off the functions thereof based on a high level signal as shown in E column. In other words, even if the first multiplexing module 12 and the second multiplexing module 13 receive a RFFE testing data signal DATA (the first signal) and a RFFE testing clock signal CLK (the second signal) transmitted from the RFFE signal module 14, or the second control terminal S0 and the third control terminal S1 receive signals of any kinds, all the output channel terminals of the first multiplexing module 12 and the second multiplexing module 13 will be closed in the above-described case.

In the present embodiment, when the processing module 11 provides a high level signal to the first control terminals $\overline{E}$ of the first multiplexing module 12 and first control terminals E of the second multiplexing module 13, the first multiplexing module 12 and the second multiplexing module 13 transform the high level signal into a low level signal as shown in E column. With reference to FIG. 3, the first multiplexing module 12 and the second multiplexing module 13 then respectively determine which one of the first output channel terminal Y0, the second output channel terminal Y1, the third output channel terminal Y2 and the fourth output channel terminal Y3 is to be connected to the first input terminal Z for outputting the RFFE testing data signal DATA (the first signal) received by the first input terminal Z of the first multiplexing module 12 and the RFFE testing clock signal CLK (the second signal) received by the first input terminal Z of the second multiplexing module 13 based on the testing control signals, e.g. high level signals or low level signals, received by the second control terminal S0 and the third control terminal S1 of the first multiplexing module 12 and that of the second multiplexing module 13 respectively.

In the present embodiment, the processing module 11 provides a second switching signal to the second control terminal S0 of the first multiplexing module 12 and the second control terminal S0 of the second multiplexing module 13. Furthermore, the processing module 11 provides a third switching signal to the third control terminal S1 of the first multiplexing module 12 and the third control terminal S1 of the second multiplexing module 13. In other words, the processing module 11 provides the second switching signal and the third switching signal to the first multiplexing module 12 and the second multiplexing module 13 to turn on or turn off the first output channel terminal Y0, the second output channel terminal Y1, the third output channel terminal Y2, the fourth output channel terminal Y3 of the first multiplexing module 12 and the second multiplexing module 13 so that the RFFE signal module 14 can output the RFFE testing data signal DATA and the RFFE testing clock signal CLK to the first DUT 31, the second DUT 32, the third DUT 33 and the fourth DUT 34 through the first multiplexing module 12 and the second multiplexing module 13.

As shown in FIG. 3, when the second switching signal transmitted to the second control terminal S0 and the third switching signal transmitted to the third control terminal S1 are low level signals, the first output channel terminal Y0 is connected to the first input terminal Z. When the second switching signal received by the second control terminal S0 is a high level signal and the third switching signal received by the third control terminal S1 is a low level signal, the second output channel terminal Y1 is connected to the first input terminal Z. When the second switching signal received by the second control terminal S0 is a low level signal and the third switching signal received by the third control terminal S1 is a high level signal, the third output channel terminal Y2 is connected to the first input terminal Z. When the second switching signal transmitted to the second control terminal S0 of the first multiplexing module 12 is a high level signal and the third switching signal transmitted to the third control terminal S1 of the first multiplexing module 12 is also a high level signal, the fourth output channel terminal Y3 is connected to the first input terminal Z. In the present embodiment, the first multiplexing module 12 and the second multiplexing module 13 are multiplexers including one input terminal, three control terminals, and four output channel terminals, but the present disclosure is not limited thereto. In other embodiments, the first multiplexing module 12 and the second multiplexing module 13 can be multiplexers with one input terminal, four control terminals, and eight output channel terminals, or multiplexers with more output channel terminals; the present disclosure is not limited thereto.

In the present embodiment, the first output channel terminal Y0 of the first multiplexing module 12 and the first output channel terminal Y0 of the second multiplexing module 13 are electrically connected to the first DUT 31, so that the RFFE signal module 14 can provide a first RFFE testing data signal DATA1 and a first RFFE testing clock signal CLK1 to the first DUT 31 through the first multiplexing module 12 and the second multiplexing module 13 accordingly. The second output channel terminal Y1 of the first multiplexing module 12 and the second output channel terminal Y1 of the second multiplexing module 13 are electrically connected to the second DUT 32, so that the RFFE signal module 14 can provide a second RFFE testing data signal DATA2 and a second RFFE testing clock signal CLK2 to the second DUT 32 through the first multiplexing module 12 and the second multiplexing module 13 accordingly. The third output channel terminal Y2 of the first multiplexing module 12 and the third output channel terminal Y2 of the second multiplexing module 13 are electrically connected to the third DUT 33, so that the RFFE signal module 14 can provide a third RFFE testing data signal DATA3 and a third RFFE testing clock signal CLK3 to the third DUT 33 through the first multiplexing module 12 and the second multiplexing module 13 accordingly. The fourth output channel terminal Y3 of the first multiplexing module 12 and the fourth output channel terminal Y3 of the second multiplexing module 13 are electrically connected to the fourth DUT 34, so that the RFFE signal module 14 can provide a fourth RFFE testing data signal DATA4 and a fourth RFFE testing clock signal CLK4 to the fourth DUT 34 through the first multiplexing module 12 and the second multiplexing module 13 accordingly.

The first DUT 31 executes a RFFE test procedure based on the first RFFE testing data signal DATA1 and the first RFFE testing clock signal CLK1. The second DUT 32 executes a RFFE test procedure based on the second RFFE testing data signal DATA2 and the second RFFE testing clock signal CLK2. The third DUT 33 executes a RFFE test procedure based on the third RFFE testing data signal DATA3 and the third RFFE testing clock signal CLK3. The fourth DUT 34 executes a RFFE test procedure based on the fourth RFFE testing data signal DATA4 and the fourth RFFE testing clock signal CLK4.

In the present embodiment, the first RFFE testing data signal DATA1, the second RFFE testing data signal DATA2, the third RFFE testing data signal DATA3 and the fourth RFFE testing data signal DATA4 are identical to each other. However, in other embodiments, the first RFFE testing data signal DATA1, the second RFFE testing data signal DATA2, the third RFFE testing data signal DATA3 and the fourth RFFE testing data signal DATA4 can be different, and the present disclosure is not limited thereto. In the present embodiment, the first RFFE testing clock signal CLK1, the second RFFE testing clock signal CLK2, the third RFFE testing clock signal CLK3 and the fourth RFFE testing clock signal CLK4 are identical to each other. However, in other embodiments, the first RFFE testing clock signal CLK1, the second RFFE testing clock signal CLK2, the third RFFE testing clock signal CLK3 and the fourth RFFE testing clock signal CLK4 can be different.

In other words, the first DUT 31, the second DUT 32, the third DUT 33 and the fourth DUT 34 can execute RFFE test procedures identical to or different from each other in sequence.

[The embodiment of the radio frequency front end testing method]

A RFFE testing method is further provided in the present disclosure. The RFFE testing method includes the following steps: transmitting a RFFE testing control signal (Step S100); switching from one to another a plurality of output channel terminals of a first multiplexing module and a second multiplexing module in turn, and providing a RFFE testing data signal and a RFFE testing clock signal to a plurality of devices under test (Step S110); and a plurality of devices under test executing a RFFE test procedure based on the RFFE testing data signal and the RFFE testing clock signal (Step S120).

In the present embodiment, the RFFE testing method is applicable to the RFFE testing device 1 and the RFFE testing system 100 described in the aforementioned embodiments. Therefore, the functionality and the structure of the RFFE testing device 1 and the RFFE testing system 100 are omitted.

In the Step S100, the computer device 2 of the RFFE testing system 100 transmits a RFFE testing control signal to the processing module 11 through the universal asynchronous receiving-transmitting module 15. In the present embodiment, the universal asynchronous receiving-transmitting module 15 is a RS232 serial port. In other embodiments, the universal asynchronous receiving-transmitting module 15 can be a RS232 standard port, a RS449 standard port, a RS423 standard port, a RS422 standard port, a RS485 standard port, or a standard bus; the present disclosure is not limited thereto. In other words, the computer device 2 transmits the RFFE testing control signal through the universal asynchronous receiving-transmitting module 15.

In Step S110, the processing module 11 is electrically connected to the first multiplexing module 12 and the second multiplexing module 13 through a general purpose input/output interface (GPIO), and provides switching signals to the first multiplexing module 12 and the second multiplexing module 13. However, in other embodiments, the processing module 11 can be electrically connected to the first multiplexing module 12 and the second multiplexing module 13 through an inter-integrated circuit (I²C) or a serial general purpose input/output interface (SGPIO), and the present disclosure is not limited thereto.

The RFFE testing data signal DATA and the RFFE testing clock signal CLK are provided by the RFFE signal module 14. The RFFE signal module 14 includes a first signal terminal (not shown in the drawings) and a second signal terminal (not shown in the drawings).

The first signal terminal is used for outputting a first signal, and the second signal terminal is used for outputting a second signal. In the present embodiment, the first signal is a RFFE testing data signal, and the second signal is a RFFE testing clock signal. The first signal terminal (not shown in the drawings) of the RFFE signal module 14 is electrically connected to the first input terminal Z of the first multiplexing module 12, and the second signal terminal (not shown in the drawings) of the RFFE signal module 14 is electrically connected to the first input terminal Z of the second multiplexing module 13.

The processing module 11 provides a first switching signal to the first control terminal E of the first multiplexing module 12 and the first control terminal $\overline{E}$ the second multiplexing module 13 respectively to turn on or turn off the first multiplexing module 12 and the second multiplexing module 13. Furthermore, the processing module 11 transmits a second switching signal to the second control terminals S0 of the first multiplexing module 12 and a third switching signal to the third control terminal S1 of the first multiplexing module 12 respectively, and transmits a second switching signal to the second control terminal S0 of the second multiplexing module 13 and a third switching signal to the third control terminal S1 of the second multiplexing module 13 respectively to turn on or turn off the first output channel terminal Y0, the second output channel terminal Y1, the third output channel terminal Y2, and the fourth output channel terminal Y3.

In the present embodiment, the first output channel terminal Y0 of the first multiplexing module 12 and the first output channel terminal Y0 of the second multiplexing module 13 are electrically connected to the first DUT 31. The second output channel terminal Y1 of the first multiplexing module 12 and the second output channel terminal Y1 of the second multiplexing module 13 are electrically connected to the second DUT 32. The third output channel terminal Y2 of the first multiplexing module 12 and the third output channel terminal Y2 of the second multiplexing module 13 are electrically connected to the third DUT 33. The fourth output channel terminal Y3 of the first multiplexing module 12 and the fourth output channel terminal Y3 of the second multiplexing module 13 are electrically connected to the fourth DUT 34.

In the present embodiment, the RFFE signal module 14 provides a first RFFE testing data signal DATA1 and a first RFFE testing clock signal CLK1 to the first DUT 31 through the first multiplexing module 12 and the second multiplexing module 13 respectively. The RFFE signal module 14 provides a second RFFE testing data signal DATA2 and a second RFFE testing clock signal CLK2 to the second DUT 32 through the first multiplexing module 12 and the second multiplexing module 13 respectively. The RFFE signal module 14 provides a third RFFE testing data signal DATA3 and a third RFFE testing clock signal CLK3 to the third DUT 33 through the first multiplexing module 12 and the second multiplexing module 13. The RFFE signal module 14 provides a fourth RFFE testing data signal DATA4 and a fourth RFFE testing clock signal CLK4 to the fourth DUT 34 through the first multiplexing module 12 and the second multiplexing module 13.

In Step S120, the first DUT 31 executes the RFFE test procedure based on the first RFFE testing data signal DATA1 and the first RFFE testing clock signal CLK1. The second DUT 32 executes the RFFE test procedure based on the second RFFE testing data signal DATA2 and the second RFFE testing clock signal CLK2. The third DUT 33 executes the RFFE test procedure based on the third RFFE testing data signal DATA3 and the third RFFE testing clock signal CLK3. The fourth DUT 34 executes the RFFE test procedure based on the fourth RFFE testing data signal DATA4 and the fourth RFFE testing clock signal CLK4.

In the present embodiment, the first RFFE testing data signal DATA1, the second RFFE testing data signal DATA2, the third RFFE testing data signal DATA3 and the fourth RFFE testing data signal DATA4 are identical to each other. In other embodiments, the first RFFE testing data signal DATA1, the second RFFE testing data signal DATA2, the third RFFE testing data signal DATA3 and the fourth RFFE testing data signal DATA4 can be different from each other, and the present disclosure is not limited thereto. In the present embodiment, the first RFFE testing clock signal CLK1, the second RFFE testing clock signal CLK2, the third RFFE testing clock signal CLK3 and the fourth RFFE testing clock signal CLK4 are identical to each other. In other embodiments, the first RFFE testing clock signal CLK1, the second RFFE testing clock signal CLK2, the third RFFE testing clock signal CLK3 and the fourth RFFE testing clock signal CLK4 can be different from each other, and the present disclosure is not limited thereto. In other words, the first DUT 31, the second DUT 32, the third DUT 33 and the fourth DUT 34 can execute RFFE test procedures identical to or different from each other in sequence, and the present disclosure is not limited thereto. According to the above descriptions, the RF front end testing system and the RF front end testing device of the embodiments of the present disclosure can greatly reduce the operation of manually providing the RF front end test signal, and can effectively utilize the RF front end signal module. Therefore, the test process can be effectively simplified and executed in a cost-efficient way.

The above-mentioned descriptions represent merely the exemplary embodiments of the instant disclosure, without any intention to limit the scope of the instant disclosure thereto. Various equivalent changes, alterations or modifications based on the claims of present disclosure are all consequently viewed as being embraced by the scope of the instant disclosure.

What is claimed is:

1. A testing device for a radio frequency front end, used for testing a radio frequency front end module, the testing device for a radio frequency front end comprising:
    a processing module, receiving a testing control signal from a computer device;
    a first multiplexing module including:
        a first input terminal;
        a first control terminal;
        a second control terminal;
        a third control terminal;
        a first output channel terminal;
        a second output channel terminal;
        a third output channel terminal; and
        a fourth output channel terminal, wherein the first control terminal, the second control terminal and the third control terminal of the first multiplexing module are electrically connected to the processing module; and
a second multiplexing module, including:
a first input terminal;
a first control terminal;
a second control terminal;
a third control terminal;
a first output channel terminal;
a second output channel terminal;
a third output channel terminal; and
a fourth output channel terminal, wherein the first control terminal, the second control terminal and the third control terminal of the second multiplexing module are electrically connected to the processing module;
a radio frequency front end signal module, including a first signal terminal and a second signal terminal, wherein the radio frequency front end signal module provides a first signal and a second signal through the first signal terminal and the second signal terminal, respectively; the first signal terminal of the radio frequency front end signal module is electrically connected to the first input terminal of the first multiplexing module; the second signal terminal of the radio frequency front end signal module is electrically connected to the first input terminal of the second multiplexing module;
wherein the first output channel terminal of the first multiplexing module and the first output channel terminal of the second multiplexing module are electrically connected to a first device under test; the second output channel terminal of the first multiplexing module and the second output channel terminal of the second multiplexing module are electrically connected to a second device under test; the third output channel terminal of the first multiplexing module and the third output channel terminal of the second multiplexing module are electrically connected to a third device under test; and the fourth output channel terminal of the first multiplexing module and the fourth output channel terminal of the second multiplexing module are electrically connected to a fourth device under test.

2. The testing device for a radio frequency front end of claim 1, wherein, the processing module switches the first output channel terminal, the second output channel terminal, the third output channel terminal and the fourth output channel terminal of the first multiplexing module and the second multiplexing module sequentially such that a test procedure is executed on the first device under test, the second device under test, the third device under test and the fourth device under test based on at least one testing control signal transmitted from the radio frequency front end signal module through the first multiplexing module and the second multiplexing module.

3. The testing device for a radio frequency front end of claim 1, wherein the first signal is a radio frequency front end testing data signal, and the second signal is a radio frequency front end testing clock signal.

4. The testing device for a radio frequency front end of claim 1, wherein the processing module provides a first switching signal to the first control terminal of the first multiplexing module to turn on or turn off the first multiplexing module, and the processing module provides a first switching signal to the first control terminal of the second multiplexing module to turn on or turn off the second multiplexing module.

5. The testing device for a radio frequency front end of claim 1, wherein the processing module provides a second switching signal and a third switching signal to the first multiplexing module and the second multiplexing module to turn on or turn off the first output channel terminal, the second output channel terminal, the third output channel terminal and the fourth output channel terminal of the first multiplexing module and the second multiplexing module.

6. The testing device for a radio frequency front end of claim 1, further comprising:
a universal asynchronous receiving-transmitting module, wherein the processing module is electrically connected to the computer device through the universal asynchronous receiving-transmitting module.

7. A testing device for a radio frequency front end, used for testing a radio frequency front end module, the testing device for a radio frequency front end comprising:
a processing module, receiving a testing control signal from a computer device;
a first multiplexing module electrically connected to the processing module, wherein the first multiplexing module includes a first output channel terminal and a second output channel terminal;
a second multiplexing module electrically connected to the processing module, wherein the second multiplexing module includes a first output channel terminal and a second output channel terminal; and
a radio frequency front end signal module, including a first signal terminal and a second signal terminal, wherein the radio frequency front end signal module provides a first signal and a second signal through the first signal terminal and the second signal terminal, respectively, wherein the first signal terminal of the radio frequency front end signal module is electrically connected to the first multiplexing module, wherein the second signal terminal of the radio frequency front end signal module is electrically connected to the second multiplexing module;
wherein the first output channel terminal of the first multiplexing module is electrically connected to a first device under test, the first output channel terminal of the second multiplexing module is electrically connected to the first device under test, the second output channel terminal of the first multiplexing module is electrically connected to a second device under test, the second output channel terminal of the second multiplexing module is electrically connected to the second device under test;
wherein the processing module switches the first output channel terminal and the second output channel terminal of the first multiplexing module and the second multiplexing module based on the testing control signal of the computer device such that a test procedure is executed on the first device under test and the second device under test based on the at least one testing control signal transmitted from the radio frequency front end signal module through the first multiplexing module and the second multiplexing module.

8. The testing device for a radio frequency front end of claim 7, wherein the first signal is a radio frequency front end testing data signal, and the second signal is a radio frequency front end testing clock signal.

9. A radio frequency front end testing method, comprising:
transmitting a radio frequency front end testing control signal to a testing device for a radio frequency front end, wherein the testing device for a radio frequency front end includes a first multiplexing module, a second multiplexing module and a radio frequency front end signal module, the first multiplexing module includes a first output channel terminal and a second output channel terminal, the second multiplexing module includes a first output channel terminal and a second output channel terminal, radio frequency front end signal module includes a first signal terminal and a second signal terminal;

switching the output channel terminals of the first multiplexing module and the second multiplexing module in turn, and the radio frequency front end signal module respectively providing a radio frequency front end testing data signal and a radio frequency front end testing clock signal through the output channel terminals of the first multiplexing module and the output channel terminals of the second multiplexing module to a plurality of devices under test; and executing a test procedure on the devices under test based on the radio frequency front end testing data signal and the radio frequency front end testing clock signal.

10. The radio frequency front end testing method of claim 9, wherein the radio frequency front end testing control signal is transmitted from a computer device.

* * * * *